United States Patent [19]
Defosse

[11] 3,972,684

[45] Aug. 3, 1976

[54] APPARATUS FOR FABRICATING MONOCRYSTALS

[75] Inventor: Georges Jean-Pierre Hubert Defosse, Wandre, Belgium

[73] Assignee: Elphiac, Brussels, Belgium

[22] Filed: Oct. 1, 1973

[21] Appl. No.: 402,278

[30] Foreign Application Priority Data
Oct. 3, 1972  Belgium ............................ 4441

[52] U.S. Cl. .......................... 23/273 SP; 156/620
[51] Int. Cl.² .................................... B01J 17/10
[58] Field of Search ............. 23/273 SP, 301 SP; 156/617, 618, 620

[56] References Cited
UNITED STATES PATENTS

| | | | |
|---|---|---|---|
| 3,175,891 | 3/1965 | Keller et al. | 23/301 S |
| 3,241,924 | 3/1966 | Karstensen | 23/273 SP |

FOREIGN PATENTS OR APPLICATIONS

| | | | |
|---|---|---|---|
| 79,004 | 1/1971 | Germany | 23/273 SP |
| 1,519,901 | 2/1970 | Germany | 23/273 SP |
| 1,080,071 | 4/1960 | Germany | 23/301 S |

*Primary Examiner*—Stephen J. Emery
*Attorney, Agent, or Firm*—Bacon & Thomas

[57] ABSTRACT

Process and apparatus for fabricating monocrystals from a monocrystaline germ maintained in a lower support by moving a melted portion of a bar of raw material similar to that of the germ, the raw material bar being maintained vertically in an upper support. A heating coil melts the top portion of the germ and the lower end of the raw material bar. The liquid phases obtained by the melting of the germ in the raw material bar to constitute a single molten zone are put into contact. Then the molten zone is stretched so as to obtain a substantially thin thread which becomes solid while crystallizing. The germ-bar unit is gradually moved into the coil radiating field so that a molten zone is held within the inductor field and that a monocrystal is grown from the germ through the thin thread and for producing an initial cone until the base of the cone reaches a predetermined diameter in that the growth is carried on until a cylinder having the diameter of the cone base is obtained. The lower support includes a suspension which is stiffened by means of an auxiliary support, the later being brought into contact with the lower portion of the growing monocrystal, while the germ-bar unit is gradually moved and the lower portion of the monocrystal is secured by pressure to the auxiliary support.

4 Claims, 2 Drawing Figures

APPARATUS FOR FABRICATING MONOCRYSTALS

The present invention relates to a method and an apparatus for fabricating monocrystals from a monocrystalline germ, the monocrystals being of a larger diameter and of a substantially greater length than known crystals.

It is already known to fabricate monocrystals from a monocrystalline germ which is maintained in a lower support by moving a melted portion of a polycrystalline bar made of a raw material similar to that of the germ, the bar being maintained vertically by upper support.

This known process comprises the steps of:

a. melting by means of a heating coil the top portion of the germ and the lower end of the raw material bar;

b. putting into contact the liquid phases obtained by the melting of the germ and the raw material bar to constitute a single molten zone;

c. stretching, outside the coil area, the molten zone so as to obtain a substantially thin thread which becomes solid while crystallizing;

d. gradually moving the germ-bar unit into the coil radiating field so that a molten zone is held within the coil field and that a monocrystal is grown from the germ through the thin thread and for producing an initial cone until the base of the cone reaches a predetermined diameter and that the growth is carried on until a cylinder having the diameter of the cone base is obtained.

The disadvantage of this process consists in the instability of the lower support suspension. Indeed, the thin thread has for instance a diameter of about 2mm while the diameter of the base of the cone and of the cylinder is generally between 20 and 50mm. One way of avoiding irregularities in the growth of the monocrystal consists in imparting a rotational motion to the lower support bearing the germ. It is thereby possible to fabricate monocrystals having a length which could reach 50mm. However, over this length, the process is often unexpected interrupted because of this unstable suspension.

The main object of the present invention resides in stabilizing the above-mentioned suspension and thereby to obtain monocrystals of a diameter which is even larger than 50mm and of a substantial length, which is only limited by the span of the system which could reach 1m or more.

The process according to the pressent invention is characterized in that the lower suspension is stiffened by means of auxiliary support, that this auxiliary support is brought into contact with the lower portion of the monocrystal when the later is undergoing growth, while the germ-bar unit is gradually moved, and the lower portion of the monocrystal is secured by pressure to the auxiliary support.

The main object and other objects of the present invention will become evident through the following description of a preferred embodiment.

Figure 1:
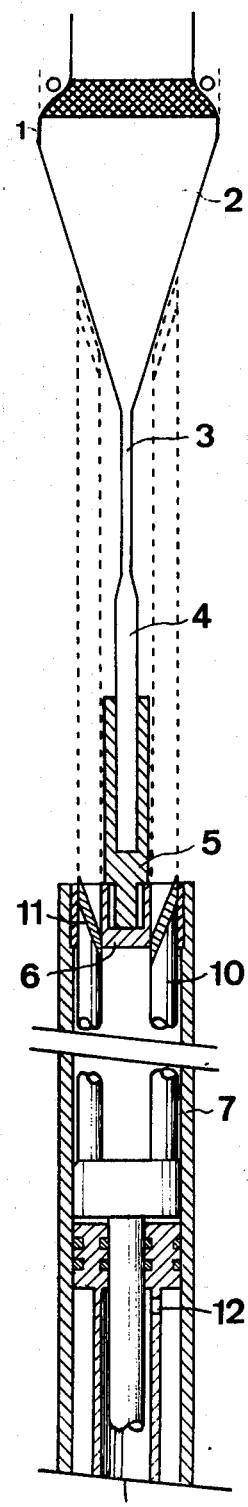
FIG. 1 is a longitudinal sectional view of the apparatus according to the present invention, which shows a germ, the lower portion of a monocrystal and the lower support of the apparatus.
Figure 1:
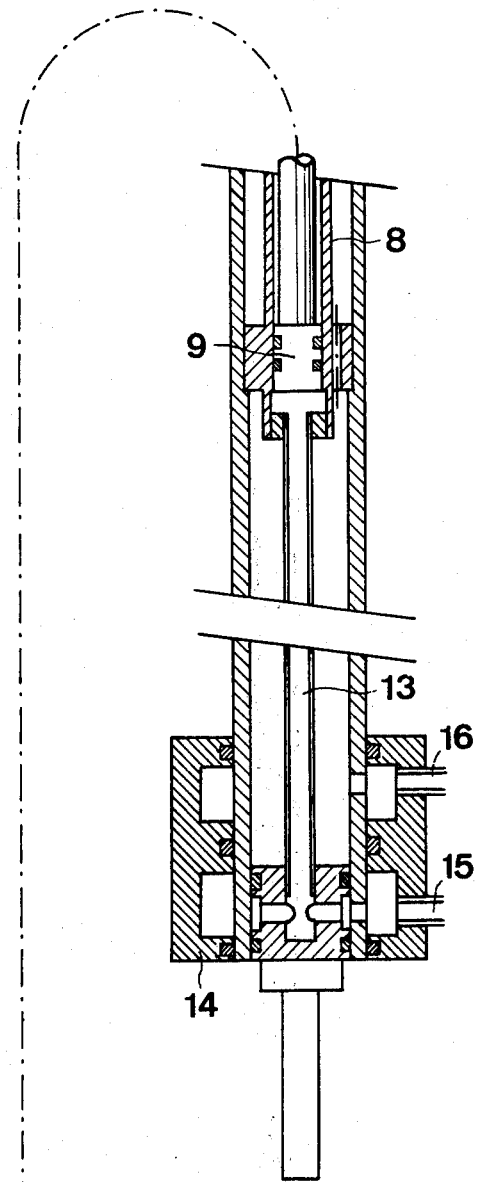

Referring to FIG. 1, a growing monocrystal constituted of a cylindrical part 1 having the same base as a conical part 2 which is linked to a germ 4 by means of a thinner cylindrical part 3, so called "thread", is illustrated.

The thread 3 has been obtained by stretching the liquified upper end of the germ 4. The lower end of the germ 4 is rigidly secured to a rotatable support by means of a holder 5 comprising at least two jaws and integrally secured to a centralizing member 6 mounted within a tube 7. The tube 7 is able to perform a rotational movement, on the one hand, and an axial longitudinal movement, on the other hand. The control mechanisms allowing these movements are not shown since they are known and consequently not part of the present invention.

Inside the tube 7 is housed an hydraulic cylinder 8 in which slides a piston 9 equipped of three rods 10. The three rods 10 are each chamfered at their top end to permit an adequate contact with the surface of cone 2 (as shown by the dot lines) and are covered with a compressible material 11, such as felt of carbon fibres, so as to apply an uniformed pressure on the cone, in spite of the surface irregularities. The rods 10 may be completely retracted (as shown) within the tube 7 when the piston 9 is set at its lowest position. These rods run through the centralizing member 6 owing to three holes pierced in this member. The piston 9 is set into motion by means of an hydraulic liquid, such as oil used for vacuum pumps, which flows from the tube 7, via a conduit 12, to the inside of the cylinder 8, above the piston 9, and, on the other hand, in the cylinder 8, below the piston 9, via a conduit 13. The oil distribution is effected by oil container 14. This container 14 is not submitted to a rotational movement, but is able to be axially displaced simultaneously with tube 7. The oil container 14 comprises two input apertures 15 and 16 for both axial movements of the piston 9.

The system operates as follows:

After cone 2 has been formed following the known growth process and during the cylindrical growing of the monocrystal, hydraulic liquid is flowed through inlet 15 until the felt covered tips 11 come into contact with the surface of the cone 2. Between the moment at which the contact is established between the tips 11 and the surface of the cone 2 and the moment at which the tips are compressed, a very light transversal displacement of cone 2 may occur, because of irregularities in the surface of the cone or following a light initial deviation. Thus, it is important to perform the movement of the rods 10 slowly enough so as to prevent any perturbation of the growth of the monocrystal. This is greatly facilitated by the hydraulic control system which, in principle, works without jerking. The pressure exercised by the hydraulic control system on the surface of the cone 2 may be either constant or variable as a function of the monocrystal growth. In any case, this pressure must be sufficiently great to compensate, at least in part, for the weight of the monocrystal which is supported by the thread 3 so as to avoid that the growth of the monocrystal be not disturbed or even interrupted following a light want of balance arising in the monocrystal or because of oscillations or instabilities from other sources. However, the pressure applied by the rods 10 on the surface of the cone 2 should not exceed the maximum traction allowable at the weakest portion between the germ and the cone and exceed the holding force of the germ 4 by the holder 5. Preferably, the position stabilizing force of the monocrystal is always maintained at its maximum admissible value, so as to obtain as a rigid link as possible between the monocrystal and the tube 7.

The use of a high quality hydraulic liquid such as oil for vacuum pumps is recommended if the hydraulic system is separated from surrounding vacuum by sealing rings, but this solution is costly because of the high price of this type of oil. Furthermore, the friction of the sealing rings against the cylinder walls may cause pulsing movements due to variations of the sliding forces which, as it is well known, are high when both sliding surfaces are at rest and are much lower when the surfaces are sliding one upon the other. It is possible to obviate the inconveniences created by pulsing movements by means of a permanent and controlled escape of hydraulic liquid through the joints, but such a solution necessitates additional auxiliary devices and is expensive.

According to the present invention, the hydraulic system comprises tight bellows which are able to be elastically elongated between an inside space thereof filled with an incompressible liquid and the surrounding vacuum, a conduit linking this inside space to a tank containing the incompressible liquid and a means for regularly pumping this liquid from the tank to the inside space of the bellows. Preferably, the pumping means is constituted of a heating device associated with the tank. Thus, when undergoing heating, the liquid is slowly expanded and ensures a substantially regular and jerkingless movement of the bellows which are elastically elongated.

Figure 2:
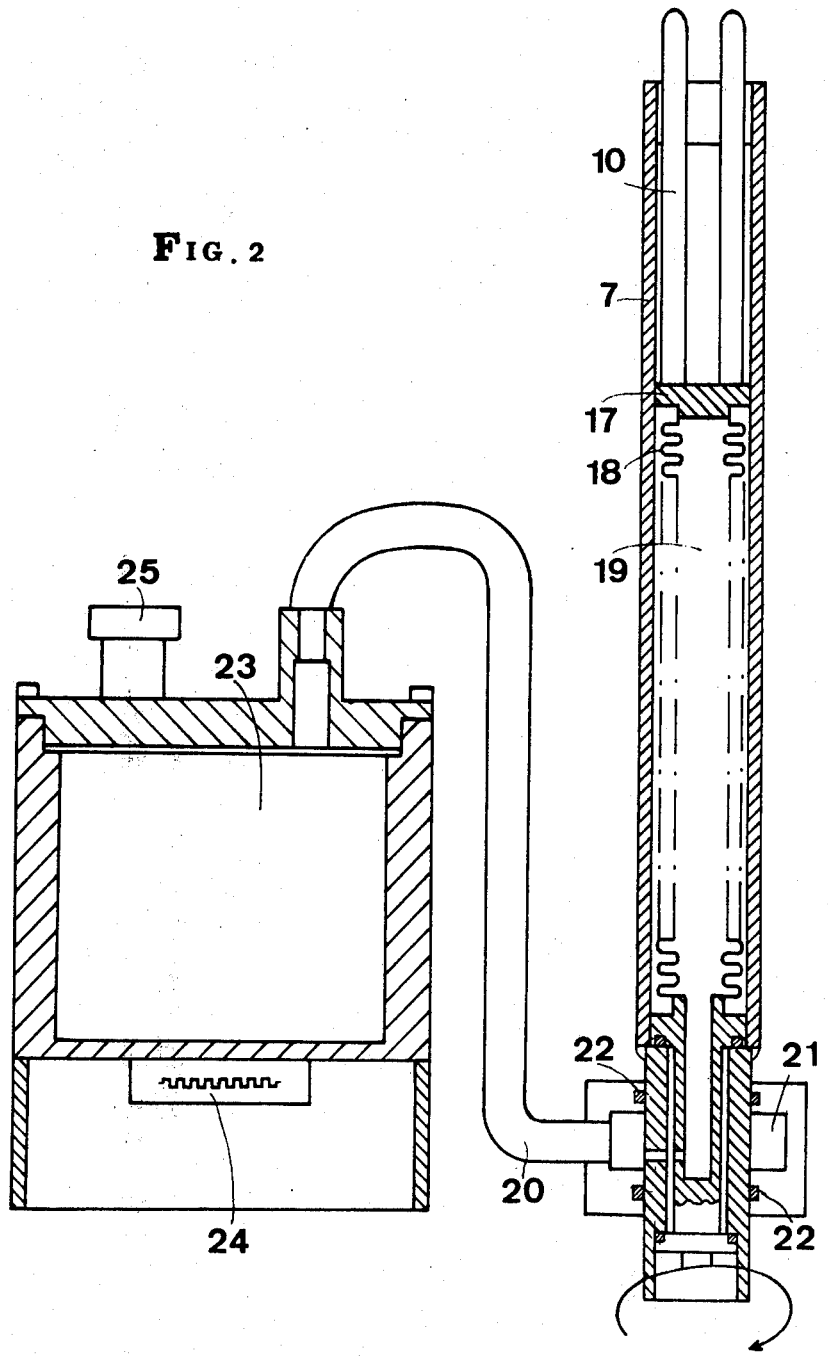
FIG. 2 depicts another embodiment of the apparatus in accordance with the invention.

This arrangement is illustrated in FIG. 2.

The rods 10 are fixed at the end 17 of bellows 18 which are made of stainless steel, the inside space 19 of which communicates via a channel 20 and a chamber 21 having two rotatable joints 22 with a tank 23 equipped with a heating resistor 24 and an adjustable security valve 25. The heating resistor is fed with a current the value of which is predetermined. The valve 25 is adjusted so as to restrict the value of the pressurizing force of rods 10 on the cone of the crystal being fabricated.

It is obviously possible to suppress the rotating joint and to mount the tank 25 directly on the rotating shaft.

The heating resistor may then be of a constant value and transmit the heat necessary for the expansion of the incompressible liquid by convection and/or by radiation.

Then, the incompressible liquid used by be an inexpensive liquid such as ordinary oil or even water. Retraction of rods 10 is achieved by letting the liquid in the tank cool down.

I claim:

1. Apparatus for fabricating monocrystals from a monocrystalline germ held by a lower rotatable support, comprising:
    a. a tube constituting said lower support,
    b. a centralizing member mounted on the head of said tube and having three holes pierced therein,
    c. a holder secured axially to said member for holding the monocrystalline germ,
    d. an auxiliary support for holding the lower portion of the growing monocrystal, constituted of three rods, one end of each being chamfered and covered with a compressible material so as to apply a uniform pressure on the surface of the monocrystal, each of said rods running through one of said holes pierced in said member, and,
    e. dilatable hydraulic means housed within said tube fixed to the auxiliary support.

2. Apparatus as claimed in claim 1, wherein said hydraulic means comprises a piston sliding within a cylinder.

3. Apparatus as claimed in claim 1, wherein said hydraulic means comprises bellows able to be elastically elongated and the inside space of which is filled with an incompressible liquid supplied from a tank which may be heated.

4. Apparatus as claimed in claim 1, wherein said auxiliary support is vertically displaceable over a range independent of both the relative positioning of said lower rotatable support and movement thereof, whereby said auxiliary support is capable of holding the lower portion of the growing monocrystal at a location independent of the distance between said location and said lower rotatable support.

* * * * *